United States Patent
Gao et al.

(10) Patent No.: US 7,297,642 B2
(45) Date of Patent: Nov. 20, 2007

(54) SPUTTER-DEPOSITED RARE EARTH ELEMENT-DOPED SILICON OXIDE FILM WITH SILICON NANOCRYSTALS FOR ELECTROLUMINESCENCE APPLICATIONS

(75) Inventors: Wei Gao, Vancouver, WA (US); Tingkai Li, Vancouver, WA (US); Robert A. Barrowcliff, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 101 days.

(21) Appl. No.: 11/334,015

(22) Filed: Jan. 18, 2006

(65) Prior Publication Data
US 2006/0183305 A1 Aug. 17, 2006

Related U.S. Application Data

(63) Continuation-in-part of application No. 11/066,713, filed on Feb. 24, 2005, now Pat. No. 7,259,055, and a continuation-in-part of application No. 11/058,505, filed on Feb. 14, 2005, now abandoned.

(51) Int. Cl.
*H01L 21/31* (2006.01)
(52) U.S. Cl. .............................. 438/787; 257/E21.462
(58) Field of Classification Search ............... 438/787; 257/E21.091, E21.169, E21.462
See application file for complete search history.

(56) References Cited

U.S. PATENT DOCUMENTS

| | | | | |
|---|---|---|---|---|
| 4,569,746 A | * | 2/1986 | Hutchinson | 204/298.09 |
| 5,500,103 A | * | 3/1996 | Katou et al. | 204/192.26 |
| 6,890,790 B2 | * | 5/2005 | Li et al. | 438/93 |
| 2004/0214362 A1 | * | 10/2004 | Hill et al. | 438/33 |

OTHER PUBLICATIONS

Maria E. Castagna et al. "High efficiency light emission devices in silicon." MRS fall meeting, 2002.

* cited by examiner

*Primary Examiner*—Lex Malsawma
(74) *Attorney, Agent, or Firm*—Law Office of Gerald Maliszewski; Gerald Maliszewski

(57) ABSTRACT

A method is provided for forming a rare earth (RE) element-doped silicon (Si) oxide film with nanocrystalline (nc) Si particles. The method comprises: providing a first target of Si, embedded with a first rare earth element; providing a second target of Si; co-sputtering the first and second targets; forming a Si-rich Si oxide (SRSO) film on a substrate, doped with the first rare earth element; and, annealing the rare earth element-doped SRSO film. The first target is doped with a rare earth element such as erbium (Er), ytterbium (Yb), cerium (Ce), praseodymium (Pr), or terbium (Tb). The sputtering power is in the range of about 75 to 300 watts (W). Different sputtering powers are applied to the two targets. Also, deposition can be controlled by varying the effective areas of the two targets. For example, one of the targets can be partially covered.

17 Claims, 3 Drawing Sheets

SPUTTER-DEPOSITED RARE EARTH ELEMENT-DOPED SILICON OXIDE FILM WITH SILICON NANOCRYSTALS FOR ELECTROLUMINESCENCE APPLICATIONS

RELATED APPLICATIONS

The application is a continuation-in-part of application entitled HIGH-LUMINESCENCE SILICON ELECTROLUMINESCENCE DEVICE, Tingkai Li et al., Ser. No. 11/066,713, filed on Feb. 24, 2005 now U.S. Pat. No. 7,259,055, which is incorporated herein by reference.

The application is a continuation-in-part of application entitled WIDE WAVELENGTH RANGE SILICON ELECTROLUMINESCENCE DEVICE, Tingkai Li et al., Ser. No. 11/058,505, filed on Feb. 14, 2005 now abandoned, which is incorporated herein by reference.

BACKGROUND OF THE INVENTION

1. Field of the Invention

This invention generally relates to integrated circuit (IC) fabrication and, more particularly, to a sputter deposition procedure for making a rare earth element-doped silicon-rich silicon oxide (SRSO) film with nanocrystalline (nc) Si particles, for use in electroluminescence (EL) applications.

2. Description of the Related Art

The observation of visible luminescence at room temperature, emanating from porous silicon (Si), has spurred a tremendous amount of research into using nano-sized Si to develop a Si-based light source. One widely used method of fabricating nanocluster Si (nc-Si) is to precipitate the nc-Si out of SiOx (x<2), producing a film using chemical vapor deposition (CVD), radio frequency (RF)-sputtering, and Si implantation, which is often called silicon-rich silicon oxide (SRSO). Er implantation, deposition (CVD), radio frequency (RF)-sputtering, and Si implantation, which is often called silicon-rich silicon oxide (SRSO). Er implantation, creating Er-doped nanocrystal Si, is also used in Si based light sources. However, state-of-the-art implantation processes have not been able to distribute the dopant uniformly, which may be important for high-efficiency light emission. Ion implantation also increases costs. Interface engineering may also be important for the device performance, but it is very difficult to achieve using ion implantation. All these drawbacks limit future device applications.

Other work (Castagna et al., "High Efficiency Light Emission Devices in Silicon") describes a silicon-based light source consisting of a MOS structure with nc-Si particles and Er implanted in a thin oxide layer. After annealing at 800° C. for 30 minutes under nitrogen flux, the device shows 10% external quantum efficiency at room temperature, which is comparable to that of light emitting diodes using III-V semiconductors. However, the stability of the device is poor. Another device structure consists of a 750 Å thick silicon-rich oxide (SRO) gate dielectric layer doped with rare earth ions (Er, Tb, Yb, Pr, Ce) via ion implantation. After similar annealing, the device shows much more stable properties but the efficiency drops off to 0.2%

Undoped silicon nano particles possess a wide wavelength distribution in its light emission spectrum, due to its particle size distribution. On the other hand, RE doped SRSO emits light in discrete wavelengths correspondent to the intra 4f transitions of the RE atoms. For example, the main emission wavelengths for terbium, ytterbium, and erbium-doped SRSO are located at the wavelengths of 550 nm, 983 nm, and 1540 nm respectively. The monochromaticity of the RE-related light emission from doped silicon nano particles provides much better control over the wavelength, giving it wider application in optical communications.

To fabricate doped silicon-rich oxide, RE ion implantation has previously been explored. Although ion implantation provides for purity and flexibility, it is expensive and the dosage that can be implanted is limited. Dopant concentration in any particular depth direction is difficult to control and the concentration of dopant is not uniform.

SUMMARY OF THE INVENTION

The present invention provides a method of depositing RE-doped SRSO by a sputtering process. The doped SRSO film, in turn, can be annealed into a film that contains actively doped silicon nano particles imbedded in silicon oxide matrix for electroluminescence (EL) applications. In one aspect for example, terbium (Tb)-doped SRSO is deposited in Edwards 360 reactive DC sputtering system by using a specially designed RE-embedded Si target. The annealed film shows very strong Tb-related photoluminescence (PL) signals, making it useful in EL device applications.

Accordingly, a method is provided for forming a rare earth (RE) element-doped silicon (Si) oxide film with nanocrystalline (nc) Si particles. The method comprises: providing a first target of Si, embedded with a first rare earth element; providing a second target of Si; co-sputtering the first and second targets; forming a Si-rich Si oxide (SRSO) film on a substrate, doped with the first rare earth element; and, annealing the rare earth element-doped SRSO film. The first target is doped with a rare earth element such as erbium (Er), ytterbium (Yb), cerium (Ce), praseodymium (Pr), or terbium (Tb).

The sputtering power is in the range of about 75 to 300 watts (W). In one aspect, different sputtering powers are applied to the two targets. In another aspect, deposition is controlled by varying the effective areas provided by the two targets. For example, one of the targets can be partially covered. This control creates doping profiles that are not available using ion implantation. For example, a uniformly doped SRSO film can be formed in a single co-sputtering process. As another example, a first thickness of SRSO film can be formed having a first RE first doping concentration, and a second thickness of SRSO film can be formed overlying the first thickness, having a first RE second doping concentration, different from the first concentration.

Additional details of the above-described process and EL devices fabricated using the above-mentioned process are provided below.

DETAILED DESCRIPTION

Figure 1:
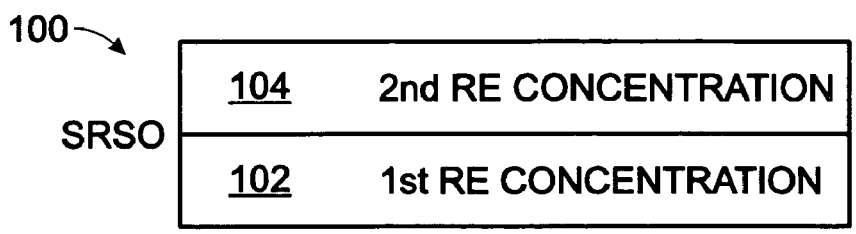
FIG. 1 is a partial cross-sectional view of a silicon-rich silicon oxide (SRSO) film.

FIG. 1 is a partial cross-sectional view of a silicon-rich silicon oxide (SRSO) film. The SRSO film 100 comprises a first thickness 102 doped with a first concentration of a rare earth (RE) element. A second thickness 104, overlies the first thickness 102, and is doped with a second concentration of the RE element. In one aspect, the first concentration of RE dopant is greater than the second concentration. In another aspect, the second concentration of RE dopant is greater than the first. The film of FIG. 1 is intended to depict a simple exemplary RE doping profile that can be obtained using a two-target sputtering process to deposit the RE-doped SRSO film 100. Other, more complicated, profiles may be created using the same basic methodology.

As in all the SRSO films described below, SRSO film 100 is primarily silicon dioxide, with extra Si. After annealing, the Si atoms agglomerate together to form Si nano particles imbedded in a silicon oxide matrix. The silicon richness can be represented by refractive index of the film n. For pure $SiO2$, n=1.46. For SRSO film 100, n varies from 1.5 to 2.2. Further, the SRSO film 100 is doped with an RE concentration in the range of 2 to 10%.

Figure 2:
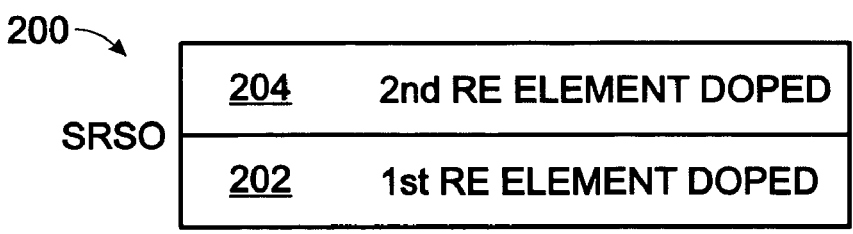
FIG. 2 is a partial cross-sectional view of a variation of the SRSO film of FIG. 1

FIG. 2 is a partial cross-sectional view of a variation of the SRSO film of FIG. 1. The SRSO film 200 comprises a first thickness 202 doped with a first RE element. A second thickness 204 overlies the first thickness 202, and is doped with a second RE element. The film of FIG. 2 is intended to depict a simple exemplary RE doping profile that can be obtained using a three-target sputtering process to deposit the RE-doped SRSO film 200. More than three targets can be used to create more complex profiles.

Figure 3:
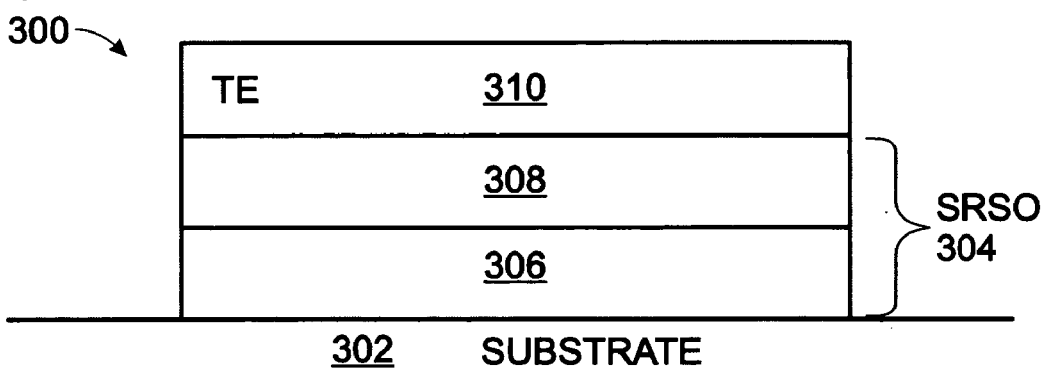
FIG. 3 is a partial cross-sectional view of an electroluminescence (EL) device.

FIG. 3 is a partial cross-sectional view of an electroluminescence (EL) device. The EL device 300 comprises a bottom substrate 302. A silicon-rich silicon oxide (SRSO) film 304 includes a first thickness 306 overlying the substrate 302, doped with a first concentration of a rare earth (RE) element. A second thickness 308 of SRSO overlies the first thickness, and is doped with a second concentration of the RE element. In one aspect, the first concentration of RE dopant is greater than the second concentration. In another aspect, the second concentration of RE dopant is greater than the first. A top electrode (TE) 310 overlies the SRSO film 304.

In one aspect, the substrate 302 is either an n-type or p-type Si substrate. In other aspects, the substrate 302 or the top electrode 310 can be a transparent material such as ITO, ZnO:Al, or Au. Other materials that can be used for the substrate and top electrode include aluminum (Al), zinc oxide (ZnO), chromium (Cr), Pt, Ir, AlCu, Ag, YBCO, $RuO_2$, and $La_{1-x}Sr_xCoO_3$. The device of FIG. 3 is intended to depict a simple exemplary EL device that can be obtained using a two-target sputtering process to deposit the RE-doped SRSO film 304.

For light generated using Er doping, the light at IR wavelengths can be detected through a silicon substrate 302. In this case, the top electrode can be opaque. For the light generated via Tb emission, the wavelength is around 550 nm, in the visible range. The top electrode in this case must necessarily be a transparent for the light to be detected, as visible-range light cannot be detected through a Si substrate.

Figure 4:
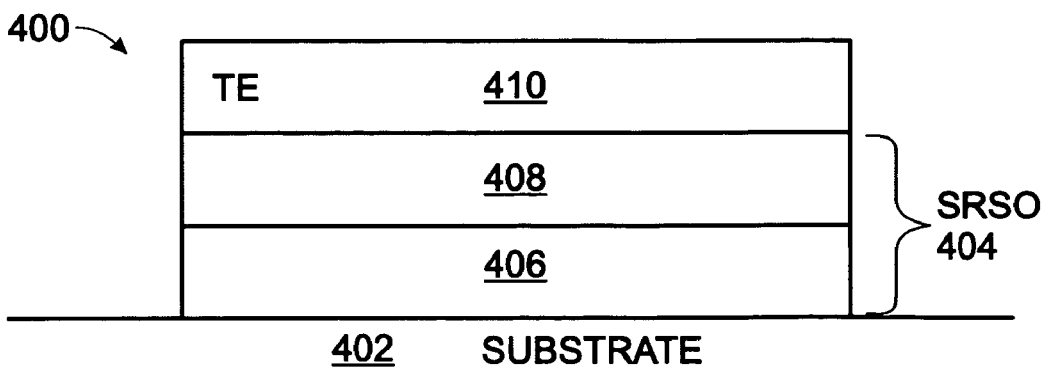
FIG. 4 is a partial cross-sectional view of a variation of the EL device of FIG. 3.

FIG. 4 is a partial cross-sectional view of a variation of the EL device of FIG. 3. The EL device 400 comprises a bottom substrate 402 and a SRSO film 404. A first thickness 406 of SRSO overlies the substrate 402, and is doped with a first rare earth (RE) element. A second thickness 408 of SRSO overlies the first thickness 406, and is doped with a second RE element. For example, the first RE can be Er and the second RE can be Tb. A top electrode 410 overlies the SRSO film 404.

Function Description

By using a specially designed RE-imbedded target with another, pure silicon target, RE-doped SRSO film can be deposited in different concentration profiles, to fabricate SRSO films with varied dopant concentrations. As an example, the fabrication of a Tb-doped silicon nano-particle SRSO thin film is presented below. The deposition and annealing conditions are listed in Table 1. The sputtering power can be changed to alter the silicon richness, while maintaining the Tb/Si ratio. PL measurements associated with these samples, with a variety of annealing conditions (from as-deposited to 1000° C.) are also presented.

TABLE 1

Deposition and post annealing conditions for Tb-doped SRSO films

| Sputtering power | Pressure | Temperature | Gas | Annealing temperature |
|---|---|---|---|---|
| 75-300 W | 7-8 mtorr | 225° C. | 15% $O_2$/Ar | 900-1100° C. |

Figure 5:
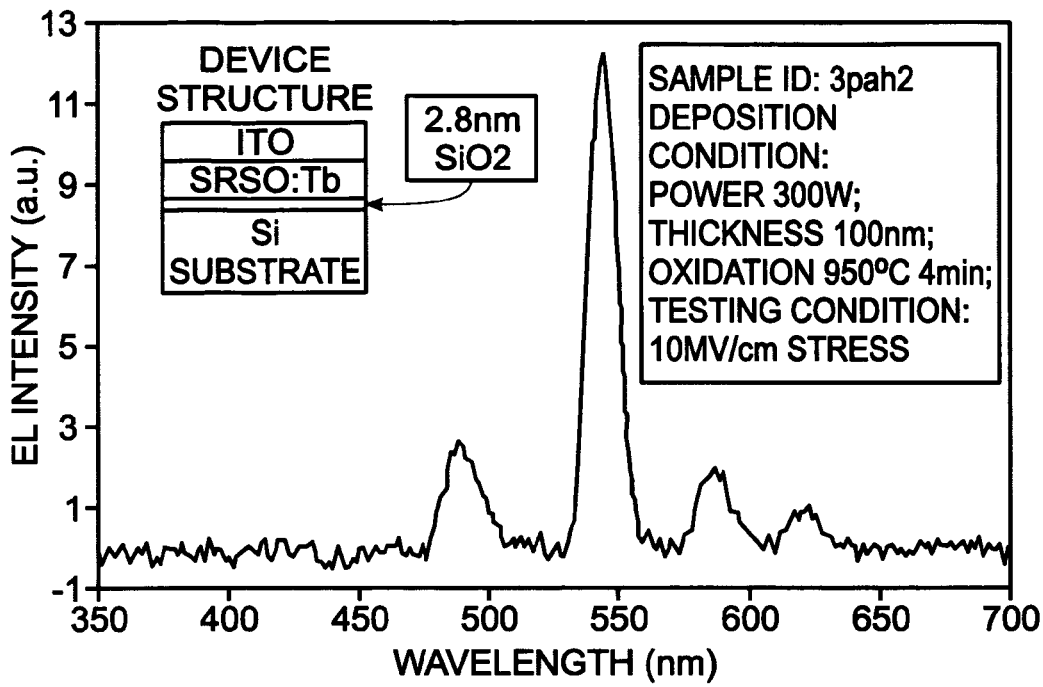
FIG. 5 is a graph depicting EL measurements of an exemplary EL device.

FIG. 5 is a graph depicting EL measurements of an exemplary EL device. The device tested has a Si substrate, covered with a 2.8 nm layer of silicon dioxide. A Tb-doped SRSO film overlies the silicon dioxide, and an ITO top electrode covers the SRSO film. The SRSO was sputtered at a power level of 300 W, annealed in an oxygen atmosphere at 950° C., for 4 minutes. The emissions at 550 nm prove that Tb is incorporated into the film. Quite different from EL emission from silicon nano-particles, RE-related EL emission have discrete wavelengths that correspondent to the intra-4f transition in the RE atoms. The graph shows that post-deposition annealing does not shift the emission wavelengths, which is another proof of RE involvement. Conventional silicon nano particle films, without RE dopants, normally show a shift in emission wavelength as a result of varied annealing conditions.

Figure 6:
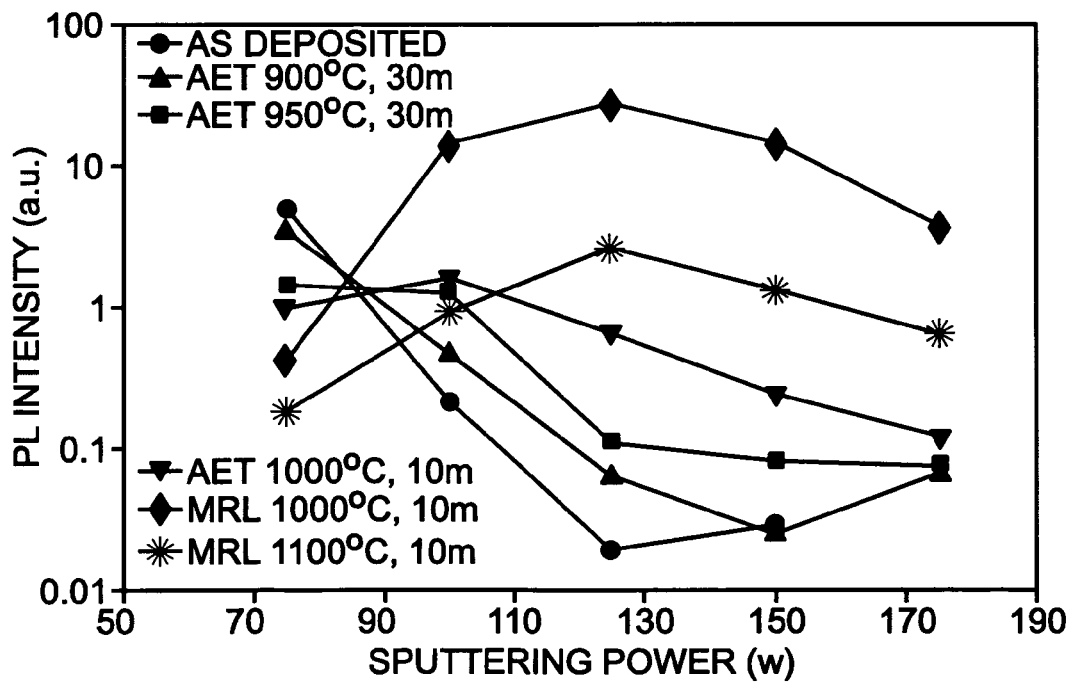
FIG. 6 is a plot depicting the realtionship between PL, sputtering power, and annealing conditions.

FIG. 6 is a plot depicting the realtionship between PL, sputtering power, and annealing conditions. The peak PL intensity (at 544 nm) changes with annealing conditions and sputtering power. A systematic shift of the maximum PL intensity is associated with a higher sputtering power when the annealing temperature is increased. The maximum PL occurs at an annealing temperature of 1000° C. using MRL equipment, in $N_2$, with an annealing time of 10 minutes (m), when the sputtering power is 125 W. At a sputtering power of 75 W, the composition of the film is basically $SiO_2$ with no extra silicon. The PL intensity decreases with an increase in annealing temperature. These relationships show the versatility of the RE-doped sputtering method, and point to new silicon nano-particle based EL device applications.

In one simple aspect, a RE-doped SRSO film with different doping concentrations can be deposited by using different sputtering power on two targets, and/or by partially covering one of the targets. In another aspect, the doping concentration can be varied across the SRSO film thickness, by varying the sputtering power during the deposition, or by varying the exposed area of either one of the target during the deposition. In this manner, the doping concentration can be manipulated to achieve dopant profile engineering and/or interface engineering.

Figure 8:
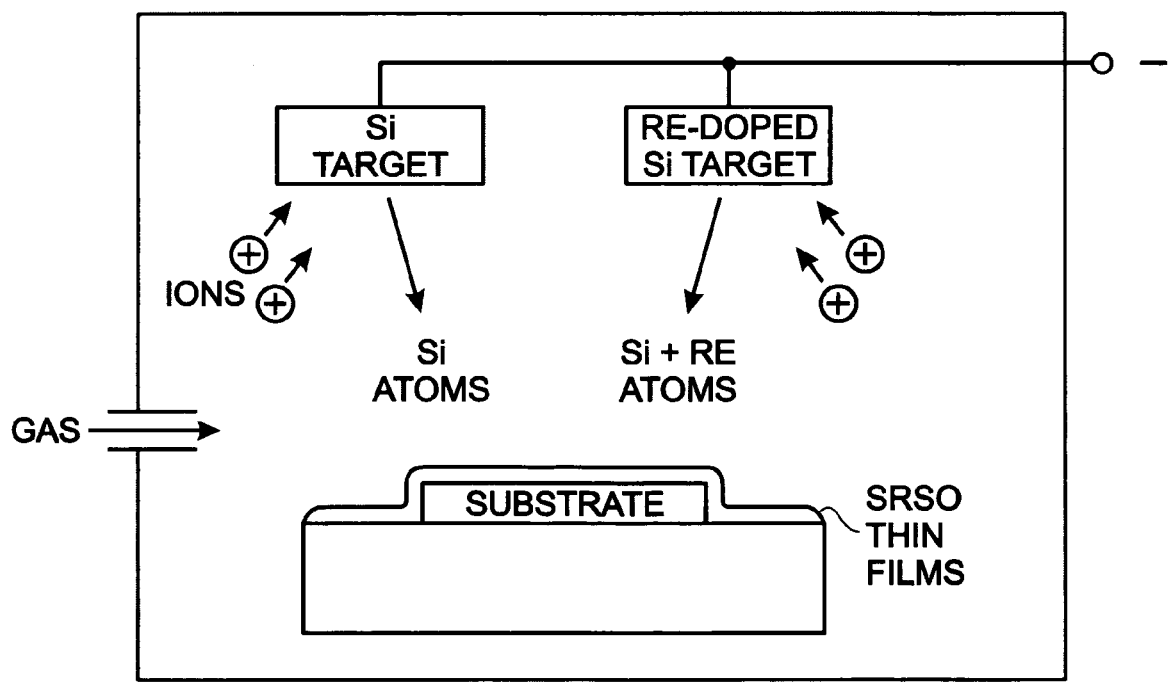
FIG. 8 is a schematic block diagram of a DC sputtering system using a Si target and a RE-doped Si target.

FIG. 8 is a schematic block diagram of a DC sputtering system using a Si target and a RE-doped Si target. The ions are supplied by a plasma that is induced in the sputtering equipment. A variety of techniques are used to modify the plasma properties, especially ion density, to achieve the desired sputtering conditions. The target can be biased with a direct current (DC) voltage (DC sputtering). Alternating radio frequency (RF) current can also be used to bias the target. Magnetron sputtering systems use magnetic fields to control and confine ion flow. While DC sputtering equipment is the simplest and cheapest to use, the present invention sputtering process can be enabled with any sputtering process.

Although the sputtered atoms are ejected from the target in a gas phase, they condense back into a solid phase upon colliding a substrate, which results in deposition of a thin film of sputtered material.

Figure 7:
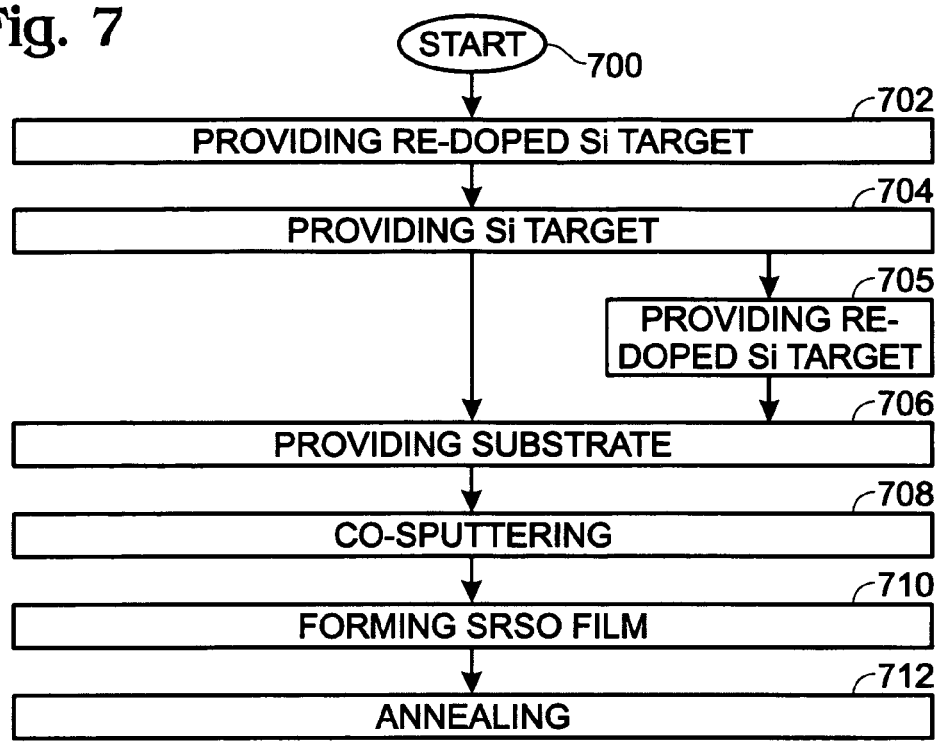
FIG. 7 is a flowchart illustrating a method for forming a RE element-doped Si oxide film with nc Si particles.

FIG. 7 is a flowchart illustrating a method for forming a RE element-doped Si oxide film with nc Si particles. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 provides a first target of Si, embedded with a first rare earth element. Some exemplary rare earth elements include erbium (Er), ytterbium (Yb), cerium (Ce), praseodymium (Pr), and terbium (Tb). However, the method is not limited to merely these examples. Step 704 provides a second target of Si. Step 706 provides a substrate. For example, the substrate can be doped Si, or doped Si with an overlying layer of silicon oxide having a thickness in the range of about 1 to 10 nm. Step 708 co-sputters the first and second targets. Step 710 forms a SRSO film on the substrate, doped with the first rare earth element. Step 712 anneals the rare earth element-doped SRSO film.

In one aspect, Step 708 co-sputters the first and second targets using a sputtering power in the range of about 75 to 300 W. In another aspect, Step 708 uses an environmental pressure in the range of about 7 to 8 milli-Torr. Typically, the substrate is heated to a temperature of about 225° C., and the first and second targets are co-sputtered using an Ar atmosphere, with about 15% oxygen.

In one aspect, equal sputtering power is applied to the two targets. Alternately, Step 708 sputters the first target at a first sputtering power and the second target at a second sputtering power, different than the first sputtering power. A similar effect can be achieved by providing a first target with a first effective area in Step 702, and providing a second target in Step 704 with a second effective area, different than the first area. For example, one target can be made with a smaller surface area or partially covered.

Using one of the above-mentioned techniques, Step 710 may form a SRSO film with a RE doping profile that includes a first thickness of SRSO film having a first RE first doping concentration. A second thickness of SRSO film overlies the first thickness, having a first RE second doping concentration, different from the first concentration.

In a different aspect, Step 712 anneals at a temperature in the range of about 900 to 1100° C., for a duration in the range of 10 to 30 minutes. The annealing is done in an atmosphere that may include $N_2$, inert gases, water vapor, oxygen, or a combination of the above-mentioned elements. The atmosphere chosen is often dependent upon the degree of oxidation desired.

As noted in the explanation of FIG. 6 above, in one aspect Step 708 decreases the sputtering power. Then, Step 712 decreases the annealing temperature and increases the annealing time, in response to decreasing the sputtering power. Alternately, if Step 708 increases the sputtering power, then typically, Step 712 increases the annealing temperature and decreases the annealing time, as a response to increasing the sputtering power.

In one aspect, Step 710 forms a uniformly doped SRSO film as a result of a single co-sputtering process (Step 708). This is a result that cannot be achieved using ion implantation.

In one variation of the method, an additional step, Step 705, provides a third target of Si, embedded with a second rare earth element. Then, Step 708 co-sputters the first, second, and third targets, and Step 710 forms a SRSO film doped with the first and second rare earth elements. For example, Step 710 may form a SRSO film with a RE doping profile that includes a first thickness of SRSO film doped with the first RE first element and a second thickness of SRSO film, overlying the first thickness, doped with the second RE element. It should be noted that Step 708 does not necessarily apply power to all three targets simultaneously. For example, the above-mentioned doping profile is achieved by initially co-sputtering just the first and second targets, and later, co-sputtering just the second and third targets.

A sputter deposition method has been provided for the fabrication of a rare earth element-doped SRSO film with nanocrystalline Si. Some process specifics have been given to illustrate the method. However, the invention is not limited to just these examples. Other variations and embodiments of the invention will occur to those skilled in the art.

We claim:

1. A method for forming a rare earth (RE) element-doped silicon (Si) oxide film with nanocrystalline (nc) Si particles, the method comprising:
   providing a first target of Si, embedded with a first rare earth element;
   providing a second target of Si;
   providing a substrate;
   co-sputtering the first and second targets;
   forming a Si-rich Si oxide (SRSO) film on the substrate, doped with the first rare earth element; and,
   annealing the rare earth element-doped SRSO film.

2. The method of claim 1 wherein co-sputtering the first and second targets includes using a sputtering power in the range of about 75 to 300 watts (W).

3. The method of claim 1 wherein co-sputtering the first and second targets includes using an environmental pressure in the range of about 7 to 8 milli-Torr.

4. The method of claim 1 wherein co-sputtering the first and second targets includes heating the substrate to a temperature of about 225° C.

5. The method of claim 1 wherein co-sputtering the first and second targets includes using an Ar atmosphere, with about 15% oxygen.

6. The method of claim 1 wherein annealing includes annealing at a temperature in the range of about 900 to 1100° C., for a duration in the range of 10 to 30 minutes.

7. The method of claim 1 wherein annealing includes annealing in an atmosphere selected from the group consisting of N2, inert gases, water vapor, oxygen, and a combination of the above-mentioned elements.

8. The method of claim 1 wherein co-sputtering the first and second targets includes decreasing the sputtering power; and,
  wherein annealing includes decreasing the annealing temperature, and increasing the annealing time, in response to decreasing the sputtering power.

9. The method of claim 1 wherein co-sputtering the first and second targets includes increasing the sputtering power; and,
  wherein annealing includes increasing the annealing temperature, and decreasing the annealing time, in response to increasing the sputtering power.

10. The method of claim 1 wherein providing the first target includes providing a target doped with a rare earth element selected from the group consisting of erbium (Er), ytterbium (Yb), cerium (Ce), praseodymium (Pr), and terbium (Tb).

11. The method of claim 1 wherein co-sputtering the first and second targets includes sputtering the first target at a first sputtering power and the second target at a second sputtering power, different than the first sputtering power.

12. The method of claim 1 wherein providing the first and second targets includes providing a first target with a first effective area, and providing a second target with a second effective area, different than the first area.

13. The method of claim 1 wherein providing the substrate includes providing a substrate selected from the group consisting of doped Si and doped Si with an overlying layer of silicon oxide having a thickness in the range of about 1 to 10 nm.

14. The method of claim 1 wherein forming the SRSO film includes forming a SRSO film uniformly doped in a single co-sputtering process.

15. The method of claim 1 wherein forming the SRSO film includes forming a SRSO film with a RE doping profile as follows:
  a first thickness of SRSO film having a first RE first doping concentration; and,
  a second thickness of SRSO film, overlying the first thickness, having a first RE second doping concentration, different from the first concentration.

16. The method of claim 1 further comprising:
  providing a third target of Si, embedded with a second rare earth element;
  wherein co-sputtering includes co-sputtering the first, second, and third targets;
  wherein forming the SRSO film includes forming a SRSO film doped with the first and second rare earth elements.

17. The method of claim 16 wherein forming the SRSO film includes following a SRSO film with a RE doping profile as follows:
  a first thickness of SRSO film doped with the first RE first element; and,
  a second thickness of SRSO film, overlying the first thickness, doped with the second RE element.

* * * * *